Aug. 5, 1958 N. E. LINDENBLAD 2,846,494

THERMOELECTRIC DEVICES

Filed Nov. 30, 1955

INVENTOR.
NILS E. LINDENBLAD

BY J. L. Whittaker

ATTORNEY 2,846,494
Patented Aug. 5, 1958

2,846,494

THERMOELECTRIC DEVICES

Nils E. Lindenblad, Princeton, N. J., assignor to Radio Corporation of America, a corporation of Delaware Application November 30, 1955, Serial No. 550,019

14 Claims. (Cl. 136—5)

The present invention relates to improved thermoelectric devices. More particularly, the invention relates to improved thermoelectric devices including high melting point iron-aluminum thermoelectric alloys.

When two wires of dissimilar metals have their ends joined as by brazing so as to form a continuous loop, a pair of junctions is established between the respective ends so joined. If now the two junctions are at different temperatures, an electromotive force will be set up in the circuit thus formed. This effect is called the thermoelectric or Seebeck effect and the device is called a thermocouple. Many arrangements of the two wires are possible: for example, the electromotive force may be read as a function of temperature by leaving one end of each wire unjoined and connecting them series-wise to a galvanometer. Such an arrangement is termed a thermocouple thermometer. A second junction still exists in such a thermometer and is constituted by the joinder of each of the free ends of the wires by means of the galvanometer. Alternatively, the opposite effect, that is a temperature increase and decrease, may be achieved at each one of the junctions respectively if a current is passed through the junctions. This is termed the Peltier effect.

Thermoelectric materials are classified as either n-type or p-type depending upon the direction of current flow across the cold junction formed by the thermoelectric metal and another metal when operating as a thermoelectric generator according to the Seebeck effect. If the positive current direction at the cold junction is from the thermoelectric metal, then it is termed a "p-type" thermoelectric material. The present invention relates to an improved thermocouple including an improved p-type thermoelectric element. The effectiveness of such elements is generally evaluated on the voltage output per ° C. difference in temperature, between the current terminals of the alloy, when the cold junction is at room temperature.

An object of the invention is to provide an improved high melting point p-type thermoelectric element having a higher E. M. F. per ° C. than heretofore attainable with high melting point, ductile materials.

Another object of the invention is to provide an improved thermocouple device having more efficient high melting point p-type and n-type thermoelectric elements.

These and other objects and advantages of the invention are accomplished by providing a p-type thermoelectric alloy of iron and aluminum as an element of an improved thermocouple.

Figure 1:
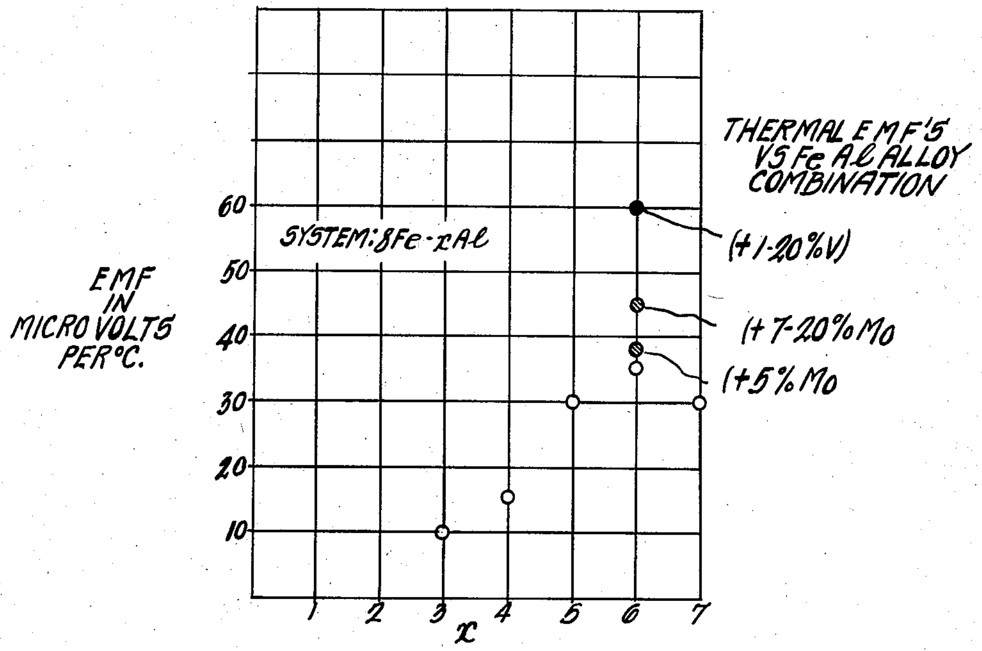
Figures 2, 3:
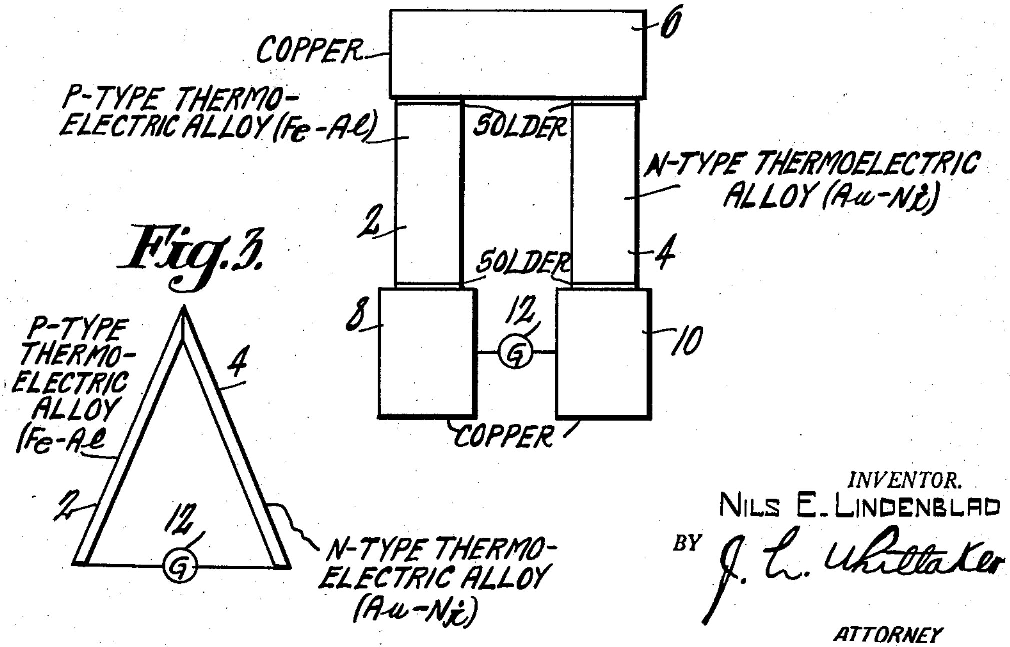

The invention will be described in greater detail with reference to the accompanying drawings in which:

Figure 1 is a chart illustrating the various E. M. F.'s in microvolts per ° C. obtained with junctions formed between copper and various aluminum-iron alloy combinations according to the invention;

Figure 2 is an elevational view illustrating one embodiment of a thermocouple device in accordance with the instant invention; and Figure 3 is an elevational view illustrating another embodiment of the thermocouple device in accordance with the instant invention.

In the art of thermoelectric high temperature measurement it is necessary that the temperature responsive element have a higher melting point than the temperature to be measured. It is also highly desirable that the element be relatively ductile so that it may be drawn or otherwise formed into various shapes and of various thicknesses such as, for example, those of a wire. In addition to these properties, the thermoelectric element must be capable of producing a useful voltage (i. e., of a magnitude large enough to be read on a galvanometer or the like). Heretofore the best-known p-type thermoelectric alloy having these properties was Chromel (80% nickel—20% chromium). Its E. M. F. (with respect to copper) is at best about 30.2 microvolts per ° C.

It has been found that alloys of iron and aluminum, in addition to being ductile and having high melting points, also have exceptionally higher thermal E. M. F.'s than prior p-type thermoelectric alloys of the high melting point ductile material class. This is especially true for iron-aluminum alloys in the range of 15.3% to 29.7% by weight aluminum (or atomic ratios of 8 atoms of iron to 3–7 atoms of aluminum). (In all of the following examples, the E. M. F.'s recorded were obtained by employing junctions between copper and the various thermoelectric alloys of the invention.) Referring to Figure 1, alloy combinations of 3 and 4 atoms of aluminum to 8 atoms of iron produce E. M. F.'s of 10 and 15 microvolts per ° C., respectively. An iron-aluminum alloy range of 5, 6, and 7 aluminum atoms to 8 iron atoms gives E. M. F.'s of 30, 35 and 30 microvolts per ° C., respectively. Thus, the preferred iron-aluminum atomic ratio is 8:6 or 4:3, or in terms of percentage, about 26.6% aluminum, balance iron.

It was further found that certain additions to the alloys of the invention resulted in even larger E. M. F.'s per ° C. For example, an addition of up to 20% molybdenum increases the thermal E. M. F. of the preferred iron-aluminum alloy from 35 to 45 microvolts per ° C. An alloy consisting of 4 atoms of iron to 3 atoms of aluminum containing 5% by weight molybdenum has an E. M. F. of 38 microvolts per ° C. Another alloy of the same iron-to-aluminum ratio containing about 7% by weight molybdenum has an E. M. F. of 45 microvolts per ° C. This E. M. F. of 45 microvolts per ° C. was found to hold good for percentage additions of from 7 to 20% molybdenum. Additions of between 20% and 25% molybdenum result in a slow drop in the E. M. F. obtained. For additions beyond this percentage, the thermal E. M. F. will continually drop further and further below values of usefulness.

An even more significant increase in the thermal E. M. F. is noted with an addition of up to 20% by weight vanadium. In the case of the 4Fe:3Al alloy the E. M. F. obtained with a 20% addition of vanadium was 60 microvolts per ° C. As in the case of molybdenum additions, increases in the vanadium percentage beyond 25% by weight result in a tapering off of the thermal E. M. F.

These alloys are prepared by melting a mixture of the two metals in the desired proportions. These metals are readily mixed in the proportions employed and the molten alloys are cast and solidified in suitable form. Thereafter the alloyed metals, being ductile, may be drawn into wires if desired. It has also been found that small additions of indium (about 5% by weight) enhances the melting of the metals without ultimately affecting the electrical characteristics of the alloy.

The known compounds of iron and aluminum are FeAl and $Fe_3Al$. It may therefore be thought that 4Fe:3Al (or 8Fe:6Al) is a proportional mixture of the compounds FeAl and $Fe_3Al$. However, the FeAl and $Fe_3Al$ compounds are ferromagnetic, whereas 4Fe:3Al is not. The iron-aluminum alloy containing 4 atoms of iron and 3 atoms of aluminum is apparently not such a mixture of the compounds FeAl and $Fe_3Al$ but rather is unique in its own right since it has been found not to be ferromagnetic. Innumerable examples of similar occurrences are well known in the art of metallurgy.

A typical thermocouple device using a p-type thermoelectric alloy according to the instant invention is shown in Figure 2. The device includes a p-type thermoelectric iron-aluminum alloy element 2, the alloy ratio preferably being 8 atoms of iron to 6 atoms of aluminum. Preferably, the p-type thermoelectric element 2 also includes up to 20% by weight molybdenum or vanadium to achieve a higher E. M. F. as described previously. The n-type thermoelectric element 4 preferably consists of an alloy of gold and nickel. Preferably this n-type thermoelectric alloy consists of 7 atoms of gold for each 5 atoms of nickel, or, percentagewise, 17.5% by weight nickel, balance gold. This novel n-type thermoelectric gold-nickel alloy element is more fully described and claimed in a co-pending application for Letters Patent, Serial No. 549,960, filed November 30, 1955, concurrently herewith. These elements may be in the form of wires or rods, for example.

As shown in Figure 2, the elements 2 and 4 are silver-soldered, brazed or welded to a copper block 6. Alternatively the ends of the elements may be directly joined one to the other by silver-soldering, brazing or welding so as to form a single junction therebetween and the copper block 6 omitted entirely. This embodiment of the invention is shown in Figure 3. As shown in Figure 2, the free ends of the elements 2 and 4 are then silver-soldered to copper terminal wires or blocks 8 and 10 respectively. The copper terminals 8 and 10 are then connected to any appropriately calibrated device such as a galvanometer 12. The junctions formed by the elements with the copper block 6 constitute, in the case of thermometry, the sensing element in this embodiment. In the embodiment shown in Figure 3 the sensing element is the point-like junction provided by the direct joinder of the two thermoelectric elements one to the other.

Many arrangements of the thermoelectric elements are possible depending upon the type of temperature measurements to be made. For example, where it is desired to make surface measurements on a planar body, the copper block 6 in the embodiment described in connection with Figure 2 will provide more surface contact than the point-like sensing element of Figure 3. On the other hand, the temperature to be measured by a device employing a copper block as in Figure 2 must be somewhat lower than the melting point of the copper block. This result is avoided in the embodiment shown in Figure 3.

It should be understood that iron-aluminum alloys employed in the present invention, as well as the gold-nickel alloys employed, will contain the usual impurities present in commercial grades of these metals, which impurities are normally present in the final alloys. Furthermore in the thermocouple device shown in Figure 2 other suitable n-type thermoelectric elements may be used instead of the preferred alloy. Suitable n-type elements may be selected from alloys of bismuth and tellurium, silver and tellurium, and copper and nickel. Examples of such n-type alloys are: 2Bi:3Te, Pb:Te; and Ag:Te. These are not all of the ductile or high melting point type.

While some of the iron-aluminum alloys mentioned have relatively low thermal E. M. F.'s, these alloys are still extremely useful in thermoelectric thermometry due to their high melting points and ductility. Hence it is desired to include these alloys within the scope of the invention as claimed herein.

What is claimed is:

1. A thermocouple including a positive thermoelectric element consisting essentially of an alloy of iron and aluminum with a ratio of 8 atoms of iron to 3–7 atoms of aluminum.

2. A thermocouple including a positive thermoelectric element consisting essentially of an alloy of iron and aluminum with a ratio of 8 atoms of iron to 5–7 atoms of aluminum.

3. A thermocouple having a positive thermoelectric element consisting essentially of an alloy of iron and aluminum with a ratio of 8 atoms of iron to 6 atoms of aluminum.

4. A thermocouple including a positive thermoelectric element consisting essentialy of an alloy of iron and aluminum with a ratio of 8 atoms of iron to 3–7 atoms of aluminum and including up to 25% by weight of an element selected from the group consisting of vanadium and molybdenum.

5. A thermocouple including a positive thermoelectric element consisting essentially of an alloy of iron and aluminum with a ratio of 8 atoms of iron to 3–7 atoms of aluminum and including up to 25% by weight molybdenum.

6. The invention according to claim 5 wherein said ratio of iron to aluminum is 8 atoms of iron to 6 atoms of aluminum.

7. A thermocouple including a positive thermoelectric element consisting essentially of an alloy of iron and aluminum with a ratio of 8 atoms of iron to 3–7 atoms of aluminum and including up to 25% by weight vanadium.

8. The invention according to claim 7 wherein said ratio of iron to aluminum is 8 atoms of iron to 6 atoms of aluminum.

9. A thermocouple comprising a positive element composed of an alloy of iron and aluminum with a ratio of 8 atoms of iron to 3–7 atoms of aluminum, and a negative element composed of an alloy of from 78 to 85.5% by weight gold, balance nickel.

10. The invention according to claim 9 wherein the alloy of which said positive element is composed includes up to 25% by weight of an element selected from the group consisting of molybdenum and vanadium.

11. The invention according to claim 9 wherein said positive element is composed of 8 atoms of iron to 5–7 atoms of aluminum.

12. The invention according to claim 9 wherein said negative element is composed of an alloy of 7 atoms of gold to 5 atoms of nickel.

13. A thermocouple comprising a positive element composed of an alloy of iron and aluminum with a ratio of 8 atoms of iron to 6 atoms of aluminum, and a negative element composed of an alloy of gold and nickel with a ratio of 7 atoms of gold to 5 atoms of nickel.

14. The invention according to claim 13 wherein the alloy of which said positive element is composed includes up to 25% by weight of an element selected from the group consisting of molybdenum and vanadium.

References Cited in the file of this patent

UNITED STATES PATENTS

| | | |
|---|---|---|
| 1,057,753 | Marsh | Apr. 1, 1913 |
| 1,346,062 | Ruder | July 6, 1920 |
| 1,527,628 | Brophy | Feb. 24, 1925 |
| 1,641,752 | Flintermann | Sept. 6, 1927 |
| 2,330,018 | Van Wert | Sept. 21, 1943 |

OTHER REFERENCES

International Critical Tables, 1929, vol. 6, p. 216.

Koester and Dannoehl: "Die Aushaertung der Gold-Nickel-Leigier-ungen," Zeitschrift für Metallkunde, p. 248.